United States Patent

Iwase (10) Patent No.: US 9,312,516 B2
(45) Date of Patent: Apr. 12, 2016

(54) FUNCTIONAL FILM AND ORGANIC EL DEVICE

(71) Applicant: FUJIFILM Corporation, Tokyo (JP)

(72) Inventor: Eijiro Iwase, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/606,298

(22) Filed: Jan. 27, 2015

(65) Prior Publication Data

US 2015/0137108 A1    May 21, 2015

Related U.S. Application Data

(63) Continuation of application No. PCT/JP2013/068107, filed on Jul. 2, 2013.

(30) Foreign Application Priority Data

Aug. 17, 2012  (JP) .................. 2012-180924

(51) Int. Cl.
*H01L 51/52* (2006.01)
*C23C 14/56* (2006.01)
*B32B 27/28* (2006.01)
(Continued)

(52) U.S. Cl.
CPC .......... *H01L 51/5253* (2013.01); *B32B 27/281* (2013.01); *B32B 27/308* (2013.01); *B32B 27/325* (2013.01); *B32B 27/365* (2013.01); *C23C 14/562* (2013.01); *B32B 2307/412* (2013.01); *B32B 2307/416* (2013.01); *B32B 2307/422* (2013.01); *B32B 2307/54* (2013.01); *B32B 2307/7242* (2013.01); *B32B 2307/7265* (2013.01); *B32B 2457/00* (2013.01);
(Continued)

(58) Field of Classification Search
CPC  H01L 51/5296; C23C 14/566; C23C 14/562; B32B 27/281
USPC ............................................ 257/437; 428/334
See application file for complete search history.

(56) References Cited

U.S. PATENT DOCUMENTS

2004/0018364 A1\*  1/2004  Ota et al. ....................... 428/447
2006/0172157 A1\*  8/2006  Kuroda ......................... 428/917
(Continued)

FOREIGN PATENT DOCUMENTS

JP   2007-30387 A    2/2007
JP   2007-253590 A   10/2007
JP   2009-269193 A   11/2009

OTHER PUBLICATIONS

International Search Report, issued in PCT/JP2013/068107, dated Oct. 8, 2013.
(Continued)

*Primary Examiner* — Caridad Everhart
(74) *Attorney, Agent, or Firm* — Birch, Stewart, Kolasch & Birch, LLP (57) ABSTRACT

A functional film of the present invention includes a support body of which a retardation value is less than or equal to 300 nm; a protective inorganic layer which is formed on the support body; one or more combinations of an inorganic layer and an organic layer which are formed on the protective inorganic layer; and a mixed layer having a thickness of 1 to 100 nm which is formed between the support body and the underlying inorganic layer, and is mixed with a component of the support body and a component of the protective inorganic layer.

12 Claims, 2 Drawing Sheets (51) Int. Cl.
  *B32B 27/30* (2006.01)
  *B32B 27/32* (2006.01)
  *B32B 27/36* (2006.01)
(52) U.S. Cl.
  CPC ......... *H01L51/5256* (2013.01); *H01L 51/5281* (2013.01); *Y10T 428/265* (2015.01)

(56) References Cited

U.S. PATENT DOCUMENTS

2007/0048459 A1* 3/2007 Takebe et al. ................ 428/1.31

2007/0224430 A1 9/2007 Iwanaga

OTHER PUBLICATIONS

Written Opion of the International Searching Authority, issued in PCT/JP2013/068107, dated Oct. 8, 2013.

Korean Office Action for Korean Application No. 10-2015-7001341, dated Dec. 16, 2015, with an English translation.

* cited by examiner

FUNCTIONAL FILM AND ORGANIC EL DEVICE

CROSS-REFERENCE TO RELATED APPLICATIONS

This application is a Continuation of PCT International Application No. PCT/JP2013/068107, filed on Jul. 2, 2013, which claims priority under 35 U.S.C. §119(a) to Japanese Patent Application No. 2012-180924, filed on Aug. 17, 2012. Each of the above application(s) is hereby expressly incorporated by reference, in its entirety, into the present application.

BACKGROUND OF THE INVENTION

1. Field of the Invention

The present invention relates to a functional film and an organic EL device. Specifically, the present invention relates to a functional film having excellent optical characteristics in addition to excellent functions such as a high gas barrier property, and to an organic EL device using the functional film.

2. Description of the Related Art

An organic EL device is a self-light emitting device, and is used in a display (a display device), an illumination device, and the like.

For example, an organic EL display has display performance advantages such as high visibility and excellent viewing angle characteristics compared to a CRT or a liquid crystal display of the related art.

In addition, an organic EL device is able to realize weight reduction and thickness reduction, and thus it is possible to enhance weight reduction or thickness reduction of the display or the illumination device.

Furthermore, the device is configured by using a substrate with flexibility, and thus it is possible to manufacture a device having flexibility. Accordingly, a flexible display is able to be realized, and an illumination device of a shape which has not been realized so far is able to be manufactured.

In the related art, an organic EL device in which a plastic film is used as a substrate (a plastic substrate) instead of a glass substrate being used is considered for flexibility, furthermore for weight reduction, or the like.

In general, an organic EL device is configured to be interposed between sealing glass and glass of the substrate. Here, when the plastic film is used on a light extraction side of the sealing glass instead of glass, a low retardation film (a low phase difference film) formed of a polycarbonate, a cyclo-olefin polymer, or the like is required in order to improve contrast of light or suppress external light reflection. In addition, in the organic EL device, when the low retardation film is used instead of the sealing glass, the low retardation film is required to have a gas barrier property similar to that of glass.

On the other hand, when the organic EL device sealed with glass is provided with a phase difference film or a polarization plate for external light control, the low retardation film may be used as a protective film. As the low retardation film, a gas barrier film in which a gas barrier property is conferred is used, and thus it is possible to prevent the low retardation film from being separated from the glass substrate or from being deformed due to expansion of a base material by external humidity or heat.

As the gas barrier film (a plastic film in which a high gas barrier property is conferred) having a high gas barrier property, a gas barrier film having a laminated structure of an organic layer and an inorganic layer is known as disclosed in JP2009-269193A. The gas barrier film has a configuration in which a plastic film such as a PET film or a PEN film is formed as a support body, an organic layer as a base layer is formed on a surface of the support body, and an inorganic layer such as silicon nitride exhibiting a gas barrier property is formed on the organic layer.

In the gas barrier film, the organic layer is formed as a base, and thus it is possible to form a suitable inorganic layer in which there are no splits or cracks on an entire surface of the film. Accordingly, a gas barrier film which sufficiently exhibits a high gas barrier property of the inorganic layer is obtained.

In addition, the laminated structure of the organic layer as the base and the inorganic layer is formed by being repeated, and thus it is possible to obtain a higher gas barrier property. Furthermore, the organic layer for protecting the inorganic layer may be formed on the inorganic layer.

By using the gas barrier film in which the organic layer as the base and the inorganic layer are laminated in the organic EL device, it is possible to confer a high gas barrier property thereon.

However, in the organic EL device, it is difficult to use a gas barrier film in which a low retardation film is formed as a support body, and an organic layer as a base and an inorganic layer are formed.

As described above, when the plastic film is used on the light extraction side of the organic EL device, the low retardation film formed of a polycarbonate or a cyclo-olefin polymer is required to be used.

In general, the low retardation film is manufactured by solution film forming. As is well known, solution film forming is a method of manufacturing a plastic film by dissolving plastic (a resin material) to be a film in an organic solvent, by flow-casting the dissolved plastic on a flat plate or a drum, and by drying the cast.

The plastic film manufactured by the solution film forming is not molded by extrusion, stretching, or the like. For this reason, the plastic film is non-oriented, and does not have birefringence. Accordingly, it is possible to manufacture the low retardation film (a plastic film of low retardation) according to the solution film forming.

On the other hand, in the gas barrier film which is formed by laminating the organic layer to be a base and the inorganic layer, the organic layer is generally formed by a coating method.

As is well known, an organic layer may be formed by a coating method in which a coating material formed by dissolving a monomer (an oligomer), a polymerization initiator, and the like to be an organic layer in an organic solvent is prepared, the coating material is coated on a formed portion and is dried, and the monomer is polymerized by ultraviolet irradiation, electron beam irradiation, or the like.

That is, when the gas barrier film having the laminated structure of the organic layer as the base and the inorganic layer is manufactured by using the low retardation film as the support body, the organic solvent contained in the coating material for forming the organic layer as the base dissolves the low retardation film which is manufactured by solution film forming. In addition, the low retardation film is not limited to the low retardation film formed by solution film forming, but is likely to be dissolved by the organic solvent due to a chemical structure thereof.

As a result thereof, a retardation value of the low retardation film or a film which is designed to have a predetermined retardation value or to be a phase difference film is considerably changed. Furthermore, considerable degradation of various optical characteristics such as a decrease in light transmissivity of the low retardation film due to dissolution, and an increase in haze is caused.

For this reason, by using the gas barrier film in which the low retardation film is formed as the support body, and the organic layer as the base and the inorganic layer are laminated in the organic EL device, it is possible to confer a high gas barrier property thereon, but optical characteristics of an essential organic EL device are degraded.

Such a problem may be solved by selecting an organic solvent used for a coating material for forming an organic layer.

However, an organic solvent which does not dissolve the low retardation film is generally an organic solvent having a high boiling point, or an organic solvent having a high molecular weight. It is difficult for drying of the coating material using such an organic solvent to be controlled, and controllability of a dried film such as leveling is degraded.

For this reason, when an organic layer is formed by the coating material using such an organic solvent, a covering property for the surface of the support body with respect to the organic layer or surface flatness of the organic layer becomes insufficient. As a result thereof, it is not possible to form a suitable inorganic layer on the organic layer which is the base, and thus a sufficient gas barrier property may not be obtained.

On the other hand, a gas barrier film formed by laminating an inorganic layer and an organic layer in which an inorganic layer is formed on the surface of the plastic film which is the support body, the organic layer is formed thereon, and an inorganic layer is further formed thereon is also known.

For example, a gas barrier film having a configuration in which an inorganic layer formed of silicon, aluminum oxide, nitride, or the like is formed on a surface of a plastic film, an organic layer formed of a polyacrylate, a polymethacrylate, or the like is formed thereon, and an inorganic layer similar to the organic layer described above is formed, and 99.5 mass % or more of a compound forming the organic layer is solid at 25° C. is disclosed in JP2007-30387A.

Since the gas barrier film disclosed in JP2007-30387A has such a configuration, and thus has high strength, when the gas barrier film is used as a substrate of an organic EL device, it is possible to effectively suppress dark spots.

In addition, a gas barrier film in which a silicon oxynitride layer is formed on a surface of a plastic film, an organic intermediate layer formed of an acrylate compound or the like is formed thereon, and a silicon oxynitride layer is formed thereon is disclosed in JP2007-253590A.

Since the gas barrier film disclosed in JP2007-253590A has such a configuration, a gas barrier film having a high gas barrier property is obtained at high productivity by continuous film forming.

SUMMARY OF THE INVENTION

However, even when the inorganic layer is simply formed on the surface of the plastic film, and the organic layer and the inorganic layer are laminated thereon, adhesiveness between the plastic film which is an organic compound and the inorganic layer which is an inorganic compound decreases, and thus sufficient strength may not be obtained.

Furthermore, the low retardation film is considerably deformed by temperature or humidity compared to the PET film or the PEN film which is generally used as a support body of a gas barrier film formed by laminating a general organic layer and inorganic layer. In addition, the inorganic layer is hard and brittle. For this reason, when the gas barrier film in which the low retardation film is formed as the support body, and the inorganic layer and the organic layer are laminated is used under an environment of high temperature or under an environment of high humidity, the support body is deformed by the temperature or the humidity, and the inorganic layer exhibiting a gas barrier property is damaged, and thus the gas barrier property is degraded.

An object of the present invention is to solve the problems of the related art, and to provide a functional film which has a high performance such as an excellent gas barrier performance, and excellent optical characteristics, and is able to be preferably used in an organic EL device or the like, and an organic EL device using this functional film.

In order to solve the problem, a functional film of the present invention includes a support body of which a retardation value is less than or equal to 300 nm; a protective inorganic layer which is formed on the support body; one or more combinations of an inorganic layer and an organic layer as a base for the inorganic layer, the combinations being formed on the protective inorganic layer; and a mixed layer having a thickness of 1 nm to 100 nm which is formed between the support body and the protective inorganic layer, and is mixed with a component of the support body and a component of the protective inorganic layer.

In the functional film of the present invention, each of the protective inorganic layer and the inorganic layer may be a silicon nitride layer.

In addition, the organic layer may contain a silane coupling agent.

In addition, the organic layer may be a layer which is formed by polymerizing at least one of an acrylate compound and a methacrylate compound, and of which a glass transition temperature is higher than or equal to 120° C.

In addition, at least one of the acrylate compound and the methacrylate compound may be a tri- or higher functional compound.

In addition, a protective organic layer may be formed on an uppermost layer.

In addition, the protective organic layer may be a layer which is formed by polymerizing at least one of a tri- or higher functional acrylate compound and a tri- or higher functional methacrylate compound and contains a silane coupling agent, and of which a glass transition temperature is higher than or equal to 120° C.

In addition, the support body may be formed of one selected from a polycarbonate, a cyclo-olefin polymer, a cyclo-olefin copolymer, triacetyl cellulose, and a polyimide.

In addition, a formation region of the protective inorganic layer may be wider than a formation region of the organic layer.

In addition, total light beam transmissivity may be greater than or equal to 80%, haze may be less than 2%, and water vapor transmissivity may be less than $1 \times 10^{-4}$ [g/(m$^2$·day)].

Furthermore, the protective inorganic layer, or the protective inorganic layer and the inorganic layer may be formed by plasma CVD.

In addition, an organic EL device of the present invention uses the functional film of the present invention.

The functional film of the present invention having the configuration described above has an excellent performance such as a high gas barrier property due to a laminated structure of the organic layer and the inorganic layer, and good optical characteristics.

In addition, the organic EL device using the functional film of the present invention has excellent optical characteristics, and high humidity resistance.

BRIEF DESCRIPTION OF THE DRAWINGS

FIGS. 2A to 2C are diagrams conceptually illustrating examples of manufacturing devices with which the functional films of the present invention are manufactured, in which

DESCRIPTION OF THE PREFERRED EMBODIMENTS

Hereinafter, a functional film and an organic EL device of the present invention will be described in detail on the basis of preferred Examples illustrated in the appended drawings.

Figure 1A:
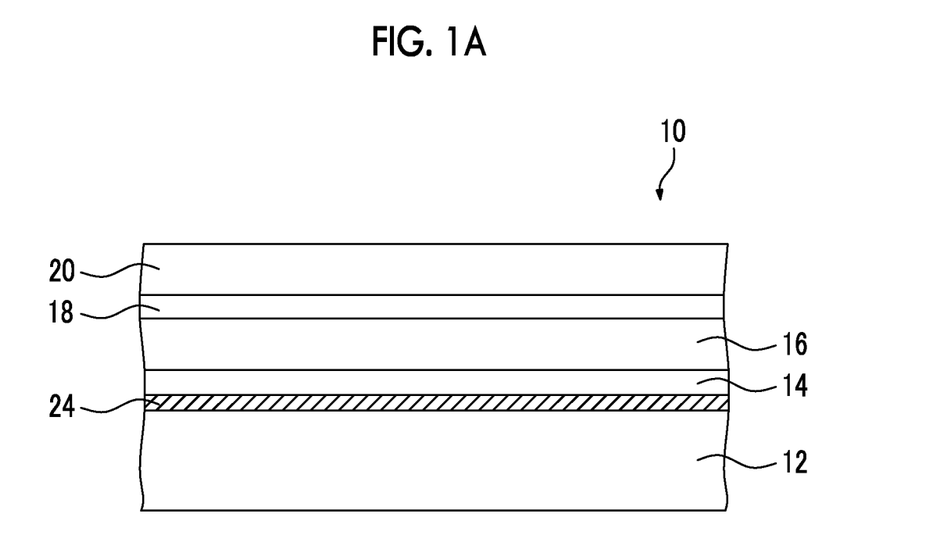
FIGS. 1A and 1B are diagrams conceptually illustrating examples of functional films of the present invention.

FIG. 1A conceptually illustrates an example in which the functional film of the present invention is used in a gas barrier film.

Furthermore, the functional film of the present invention is not limited to a gas barrier film.

That is, the present invention is able to be used in various known functional films such as various optical films such as an optical filter or an antireflection film. In the functional film of the present invention, an inorganic layer mainly exhibits a target function. Accordingly, for example, the functional film of the present invention may be configured by selecting an inorganic layer exhibiting a target function such as target optical filter characteristics.

However, the functional film of the present invention includes a protective inorganic layer, and thus it is possible to maintain optical characteristics such as a retardation value of a support body which is a low retardation film, and the functional film of the present invention includes a mixed layer between the protective inorganic layer and the support body, and thus adhesiveness between the protective inorganic layer and the support body is improved, and it is possible to preferably prevent the inorganic layer mainly exhibiting a function from being damaged.

Accordingly, the present invention is more preferably used in a gas barrier film in which good optical characteristics are usually required, and a performance is considerably degraded by the damage of the inorganic layer.

A gas barrier film 10 illustrated in FIG. 1A is a laminated gas barrier film in which an inorganic layer and an organic layer as a base for the inorganic layer are laminated as described in JP2009-269193A described above.

The gas barrier film 10 of an illustrated example includes a support body 12, a protective inorganic layer 14, an organic layer 16, an inorganic layer 18, and a mixed layer 24 formed between the support body 12 and the protective inorganic layer 14. In addition, as a preferred aspect, a protective organic layer 20 is formed on an uppermost layer of the gas barrier film 10.

Furthermore, the gas barrier film 10 illustrated in FIG. 1A includes one combination of the inorganic layer 18, and the organic layer 16 as a base for the inorganic layer 18 on the protective inorganic layer 14, but the present invention is not limited thereto.

Figure 1B:
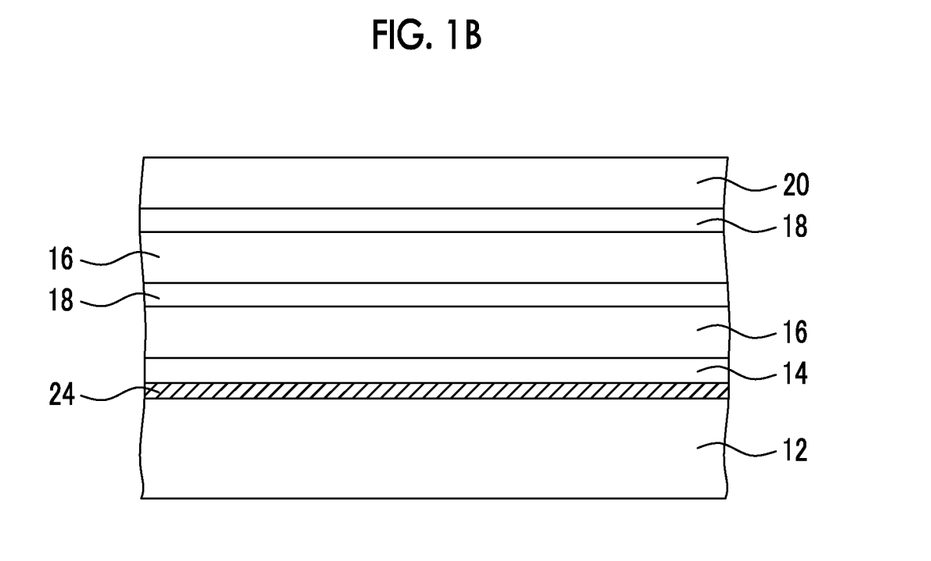

For example, as illustrated in FIG. 1B, the gas barrier film 10 may include two combinations of the inorganic layer 18, and the organic layer 16 as the base for the inorganic layer 18 on the protective inorganic layer 14 for the purpose of obtaining a higher gas barrier property. Alternatively, the gas barrier film 10 may include three or more combinations of the organic layer 16 and the inorganic layer 18 for the purpose of obtaining a higher gas barrier property.

As described above, in the gas barrier film 10, the protective inorganic layer 14, the combination of the inorganic layer 18 and the organic layer 16 as the base for the inorganic layer 18, and the protective organic layer 20 are laminated on the support body 12, and the mixed layer 24 is formed between the support body 12 and the protective inorganic layer 14.

In the gas barrier film 10, the support body 12 (a substrate (a base material)) is a sheet-like material (a low retardation film) of which a retardation value (Retardation) is less than or equal to 300 nm.

When the retardation value of the support body 12 exceeds 300 nm, optical characteristics of the gas barrier film 10 become insufficient due to a decrease in contrast of light, high external light reflection, and a decrease in visibility when the gas barrier film of the present invention is used in an organic EL device or the like.

In consideration of this point, the retardation value of the support body 12 is, preferably less than or equal to 200 nm, and more preferably less than or equal to 150 nm.

As the support body 12, various known sheet-like materials are able to be used insofar as the support body 12 has the retardation value described above.

Specifically, a plastic film formed of various plastics (a high-molecular-weight material) such as a polycarbonate, a cyclo-olefin polymer (an alicyclic polyolefin), a cyclo-olefin copolymer, triacetyl cellulose, and a transparent polyimide is preferably exemplified.

In the gas barrier film 10, the protective inorganic layer 14 is formed on the support body 12. In addition, the mixed layer 24 is formed between the support body 12 and the protective inorganic layer 14.

The protective inorganic layer 14 is a layer formed of an inorganic compound (a layer, which is a film, including an inorganic compound as a main component). The protective inorganic layer 14 functions as a protective layer for protecting the support body 12 when the organic layer 16 described later is formed.

As described above, the support body 12 is a low retardation film of which a retardation value is less than or equal to 300 nm. As described above, in general, the low retardation film is likely to be dissolved by an organic solvent.

In addition, in the gas barrier film 10 of the present invention, the organic layer 16 is basically formed by a coating method using a coating material in which a monomer, an oligomer, or the like for the organic layer 16 is dissolved in an organic solvent. Furthermore, in the coating method, in order to secure a covering property for the protective inorganic layer 14 (the inorganic layer 18), and flatness of a surface (that is, a formation surface for the inorganic layer 18 described later), it is preferable that the coating material be an organic layer 16 in which an organic solvent with a low boiling point such as methyl ethyl ketone (MEK) or methyl isobutyl ketone (MIBK) is used.

For this reason, when the organic layer 16 is formed by the coating method on the surface of the support body 12 which is the low retardation film (in particular, when the organic layer 16 is formed by the coating method using the coating material with the solvent with a low boiling point such as MEK), the support body 12 is dissolved by the solvent when the coating material is coated.

As a result thereof, the retardation value of the support body 12 is changed, and problems such as a decrease in light transmissivity or an increase in haze occur, and thus the optical characteristics of the gas barrier film are considerably degraded as described above.

Furthermore, when the organic solvent is selected, the coating material is able to be directly coated on the support body 12, and the organic solvent may have a high boiling point, and thus it is difficult to control drying, and it is difficult to uniformly cover an entire surface of the support body 12 and to form the organic layer 16 having a flat surface.

Regarding this, the gas barrier film 10 of the present invention includes the protective inorganic layer 14 on the support body 12, and the organic layer 16 is formed on the protective inorganic layer 14. For this reason, the dense protective inorganic layer 14 formed of the inorganic compound functions as a protective layer, and thus it is possible to prevent the coating material (the organic solvent) for forming the organic layer 16 from reaching the support body 12.

Accordingly, even when the organic layer 16 is formed on the support body 12 by the coating method using the low retardation film such as a polycarbonate film according to the present invention, it is possible to prevent the optical characteristics of the support body 12 from being degraded or varied. For this reason, there is no (extremely small) variation in the retardation value of the support body 12 which is a base film, the retardation value is lower, transparency such as total light beam transmissivity is higher, and haze is lower, and thus it is possible to realize the gas barrier film 10 having excellent optical characteristics.

A formation material of the protective inorganic layer 14 is not limited insofar as the material is able to form a film into which the organic solvent does not permeate, and various inorganic compounds are able to be used.

Specifically, metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; silicon oxides such as silicon oxide, silicon oxynitride, silicon oxycarbide, and silicon oxynitrocarbide; silicon nitride, silicon nitrides such as silicon nitrocarbide; silicon carbides such as silicon carbide; hydrides thereof; a mixture of two or more thereof; and an inorganic compound such as a hydrogen-containing material are preferably exemplified.

In particular, silicon nitride, silicon oxide, silicon oxynitride, and aluminum oxide are preferably used due to high transparency and extreme density thereof. Among them, in particular, silicon nitride is preferably used due to more extreme density and higher transparency.

Furthermore, in order to obtain the gas barrier film 10 having a high gas barrier property, it is preferable that the protective inorganic layer 14 also exhibit a gas barrier property similar to the inorganic layer 18 described later.

Accordingly, in consideration of this point and productivity, it is preferable that the protective inorganic layer 14 be formed of the same material as that of the inorganic layer 18 which mainly exhibits a target gas barrier property. In addition, from a viewpoint of this point and securing the optical characteristics of the support body 12, silicon nitride from which high transparency and a high gas barrier property are obtained is preferably used as the protective inorganic layer 14.

The mixed layer 24 is formed between the support body 12 and the protective inorganic layer 14.

The mixed layer 24 is a layer in which a component of the support body 12 (a formation component of the support body 12), and a component of the protective inorganic layer 14 (a formation component of the protective inorganic layer 14) are mixed.

Here, in the gas barrier film 10 of the present invention, the mixed layer 24 is not independently formed as a single layer. That is, the mixed layer 24 is a layer which is intentionally formed between the support body 12 and the protective inorganic layer 14 by controlling formation conditions of the protective inorganic layer 14 such as bias power to be supplied (applied) to the support body 12 described later when the protective inorganic layer 14 is formed.

In the gas barrier film 10 of the present invention, the protective inorganic layer 14 (or furthermore the inorganic layer 18) is basically formed (film formed) by plasma CVD such as capacitively coupled plasma CVD (CCP-CVD) or an inductively coupled plasma CVD (ICP-CVD).

In plasma CVD, created plasma is incident on the support body 12, and thus the support body 12 is etched.

When the protective inorganic layer 14 is formed by using this, intensity of the bias power to be supplied to the support body 12, an amount of the created plasma (density), temperature (substrate temperature) of the support body 12, or the like is controlled, and thus the support body 12 is strongly etched, ions for forming the protective inorganic layer 14 are actively pulled into the support body 12, and thus it is possible to form the mixed layer 24 in which the component of the support body 12 and the component of the protective inorganic layer 14 are mixed between the support body 12 and the protective inorganic layer 14.

That is, the protective inorganic layer 14 is formed while the support body 12 is strongly etched, and ions are strongly pulled toward the support body 12 by the plasma CVD, and thus at an initial stage of starting formation of the protective inorganic layer 14, a film in which there is a large amount of components of the support body 12 and a small amount of components of the protective inorganic layer 14 is formed. Furthermore, the film formation is continued, and then the component of the support body 12 is reduced, and thus the amount of component of the protective inorganic layer 14 in the film increases, and finally the protective inorganic layer 14 of a pure inorganic compound starts to be formed. Accordingly, it is possible to form the mixed layer 24 between the support body 12 and the protective inorganic layer 14.

As is well known, when an inorganic compound is formed on a surface of an organic compound, sufficient adhesiveness may not be obtained. For this reason, the gas barrier film in which the inorganic layer is formed on the support body formed of the plastic film has insufficient strength, and a gas barrier property may be degraded due to separation between the support body and the inorganic layer.

Regarding this, in the gas barrier film 10 of the present invention, the mixed layer 24 is formed between the support body 12 and the protective inorganic layer 14 such that an intermediate component is interposed therebetween, and thus it is possible to increase adhesiveness between the support body 12 and the protective inorganic layer 14. For this reason, the gas barrier film 10 of the present invention has high strength, and it is possible to prevent the gas barrier property from being degraded due to the separation between the support body 12 and the protective inorganic layer 14.

In addition, as the support body of the gas barrier film, the low retardation film such as the polycarbonate film has extremely high deformation (a heat expansion coefficient/a humidity expansion coefficient) due to temperature or humidity compared to a film which is generally used such as that of polyethylene terephthalate (PET) or polyethylene naphthalate (PEN). Furthermore, the inorganic layer is hard and brittle.

For this reason, in the gas barrier film having a layer configuration of the support body/the inorganic layer/the organic layer/the inorganic layer as described in JP2007-253590A and JP2007-30387A, when the low retardation film is used in the support body, the support body is deformed at the time of being used under a high temperature environment or a high humidity environment, and thus the inorganic layer exhibiting a gas barrier property is damaged, and the gas barrier property is degraded.

Regarding this, in the gas barrier film 10 of the present invention, the mixed layer 24 is formed between the support body 12 and the protective inorganic layer 14. The mixed layer 24 is the layer in which the component of the support body 12 and the component of the protective inorganic layer 14 are mixed, and thus has a hardness between that of both layers. For this reason, in the gas barrier film of the present invention, the mixed layer 24 functions as a relaxation layer for the deformation of the support body 12.

Accordingly, in the gas barrier film 10 of the present invention, even when the support body 12 is deformed at the time of being used under a high temperature environment or a high humidity environment, the mixed layer 24 functions as the relaxation layer, and thus it is possible to prevent the protective inorganic layer 14 and the inorganic layer 18 described later from being damaged and to maintain a high gas barrier property.

In the gas barrier film 10 of the present invention, a film thickness of the mixed layer 24 is 1 nm to 100 nm.

When the film thickness of the mixed layer 24 is less than 1 nm, it is not possible to sufficiently obtain an effect of forming the mixed layer 24. That is, it is not possible to sufficiently secure adhesiveness between the support body 12 and the protective inorganic layer 14, and it is not possible to obtain a sufficient buffering effect, and thus the inorganic layer 18 may be damaged by the deformation of the support body 12 due to temperature or humidity, and the gas barrier property may be degraded.

In contrast, when the film thickness of the mixed layer 24 exceeds 100 nm, the mixed layer 24 becomes excessively thick, and thus the optical characteristics of the gas barrier film 10 are degraded. Furthermore, when the film thickness of the mixed layer 24 exceeds 100 nm, splits, cracks, or the like may occur in the mixed layer 24, and thus the gas barrier property may be degraded.

In consideration of the points described above, the film thickness of the mixed layer 24 is, preferably 2 nm to 30 nm, and especially preferably 5 nm to 15 nm.

That is, in the laminated gas barrier film of the present invention including the inorganic layer 18 and the organic layer 16 as the base for the inorganic layer 18 from which a high gas barrier property is obtained, the low retardation film is used in the support body 12, the protective inorganic layer 14 is formed below the organic layer 16, and the mixed layer 24 having a thickness of 1 nm to 100 nm is formed between the support body 12 and the protective inorganic layer 14, and thus the optical characteristics of the support body 12 such as a retardation value are maintained, the adhesiveness of the protective inorganic layer 14 is secured, and the gas barrier property is prevented from being degraded by damage to the inorganic layer 18 due to high temperature, high humidity, or the like.

Accordingly, in the present invention, an excellent gas barrier property in which water vapor transmissivity is less than $1 \times 10^{-4}$ [g/(m$^2$·day)] and the optical characteristics of the low retardation film which is the support body 12 are maintained, and thus it is possible to obtain a gas barrier film having excellent optical characteristics and an excellent gas barrier property in which total light beam transmissivity is greater than or equal to 80% and haze is less than 2%.

In the gas barrier film 10 of the present invention, a film thickness of the protective inorganic layer 14 may be suitably set to a thickness by which it is possible to prevent the coating material (the organic solvent) for forming the organic layer 16 from reaching the support body according to a formation material.

The thickness of the protective inorganic layer 14 is preferably 10 nm to 200 nm.

When the film thickness of the protective inorganic layer 14 is greater than or equal to 10 nm, it is possible to more reliably prevent the support body 12 from being dissolved by the coating material for forming the organic layer 16. In addition, the protective inorganic layer 14 exhibits a gas barrier property, and thus it is possible to enhance an improvement of the gas barrier property, a decrease in the number of laminations of the organic layer 16 and the inorganic layer 18 described later, or the like.

In addition, when the film thickness of the protective inorganic layer 14 is less than or equal to 200 nm, it is possible to preferably prevent splits or cracks from occurring in the protective inorganic layer 14, and thus an improvement effect of the gas barrier property due to the protective inorganic layer 14 or a dissolution prevention effect for the support body 12 with respect to the coating material of the organic layer 16 are more reliably obtained.

In consideration of the points described above, the film thickness of the protective inorganic layer 14 is preferably 20 nm to 100 nm.

The film thickness of the mixed layer 24 and protective inorganic layer 14 may be controlled, for example, by using findings such as a time period from the start of the film formation to the start of the formation of the protective inorganic layer 14, a thickness of the mixed layer 24 to be formed, and a film forming rate of the protective inorganic layer 14 which are obtained by tests or simulations in which formation conditions (film formation conditions) such as bias power to be supplied to the support body 12 or temperature of the support body 12 are changed beforehand. Furthermore, when the protective inorganic layer 14 is formed, it is preferable that formation conditions such as intensity of the bias power or temperature of the support body 12 be set to be optimal conditions according to the formation material of the support body 12 for forming the protective inorganic layer 14, or the like.

In addition, the film thickness of the mixed layer 24 may be set as follows. That is, a cross-sectional surface of a laminated body including the support body 12, the mixed layer 24, and the protective inorganic layer 14 is observed by a transmission electron microscope or the like, and a distance between a lower end of the mixed layer 24 (on the support body 12 side) and an upper end of the mixed layer 24 (a distance in a film thickness direction) is measured, and thus the film thickness of the mixed layer 24 in the cross-sectional surface is measured. The measurement of the film thickness in the cross-sectional surface is performed on 10 portions which are arbitrarily selected (10 cross-sectional surfaces), and an average of the film thicknesses of the mixed layer 24 in 10 portions of the cross-sectional surface is set to a film thickness of the entire mixed layer 24.

Furthermore, it is preferable that the protective inorganic layer 14 be formed on the support body 12 at least in a region wider than or equal to the formation region of the organic layer 16 (a coating region of the coating material to be the organic layer 16). That is, in a surface direction of the gas barrier film 10, it is preferable that the protective inorganic layer 14 be formed to include the organic layer 16 (the same size includes a configuration in which positions of end portions are identical to each other).

For example, when the gas barrier film 10 of the present invention is manufactured by roll to roll as described later, it is preferable that a width of the protective inorganic layer 14 be greater than or equal to a width of the organic layer 16 (greater than or equal to a coating width of the coating material to be the organic layer 16).

Accordingly, it is possible to preferably prevent the support body 12 from being dissolved by the coating material for forming the organic layer 16 over the entire surface.

The organic layer 16 is formed on the protective inorganic layer 14 (a surface), and the inorganic layer 18 is formed on the organic layer 16 (a surface).

The organic layer 16 is a layer formed of an organic compound (a layer (a film) including an organic compound as a main component), and basically, is a layer in which a monomer and/or an oligomer are crosslinked (polymerized).

As described above, the organic layer 16 functions as a base layer for suitably forming the inorganic layer 18 which exhibits a gas barrier property. By using the organic layer 16 as the base, flatness and uniformity of the formation surface for the inorganic layer 18 are enhanced, and thus it is possible to set a state which is suitable for forming the inorganic layer 18.

Accordingly, in the laminated gas barrier film in which the organic layer 16 as the base and the inorganic layer 18 are laminated, it is possible to form the suitable inorganic layer 18 without gaps in the entire film surface, and it is possible to obtain the gas barrier film having an excellent gas barrier property of which water vapor transmissivity is less than $1 \times 10^{-4}$ [g/(m²·day)].

In the gas barrier film 10, the formation material of the organic layer 16 is not limited, and various known organic compounds (a resin/a high-molecular-weight compound) are able to be used.

Specifically, a film of a thermoplastic resin such as a polyester, an acrylic resin, a methacrylic resin, a methacrylic acid-maleic acid copolymer, a polystyrene, a transparent fluorine resin, a polyimide, a fluorinated polyimide, a polyamide, a polyamideimide, polyetherimide, cellulose acylate, a polyurethane, polyetherether ketone, a polycarbonate, an alicyclic polyolefin, a polyarylate, polyether sulfone, a polysulfone, a fluorene ring-modified polycarbonate, an alicyclic-modified polycarbonate, a fluorene ring-modified polyester, and an acryloyl compound, or a polysiloxane, and other organic silicon compounds are preferably exemplified. A plurality of materials may be combined.

Among them, it is preferable that the organic layer 16 be configured of a polymer of a radical polymerizable compound and/or a cation polymerizable compound including an ether group as a functional group from a viewpoint of excellent glass transition temperature, strength, or the like.

Among them, in particular, an acrylic resin or a methacrylic resin including a polymer of an acrylate and/or methacrylate monomer or oligomer as a main component of which a glass transition temperature is higher than or equal to 120° C. is preferably exemplified as the organic layer 16 from a viewpoint of low refractive index, high transparency, excellent optical characteristics, or the like in addition to the strength.

Among them, in particular, dipropylene glycol di(meth)acrylate (DPGDA), trimethylolpropane tri(meth)acrylate (TMPTA), and dipentaerythritol hexa(meth)acrylate (DPHA), a di- or higher functional, in particular, an acrylic resin or a methacrylic resin including a polymer of a tri- or higher functional acrylate and/or methacrylate monomer or oligomer as a main component are preferably exemplified. In addition, it is also preferable that a plurality of acrylic resins or methacrylic resins be used.

When the organic layer 16 is formed of such an acrylic resin or a methacrylic resin, it is possible to form the inorganic layer 18 on a base having a strong skeleton, and it is possible to form the inorganic layer 18 having a high gas barrier property at more extreme density.

It is preferable that the organic layer 16 contain a silane coupling agent.

When the organic layer 16 contains the silane coupling agent, it is possible to improve adhesiveness between the protective inorganic layer 14 and inorganic layer 18, and the organic layer 16.

In the organic layer 16, a content of the silane coupling agent is preferably 1 mass % to 30 mass %. When the content of the silane coupling agent is set within the range described above, it is possible to secure sufficient adhesiveness without damaging characteristics of the organic layer 16.

A thickness of the organic layer 16 is preferably 0.5 μm to 5 μm.

When the thickness of the organic layer 16 is greater than or equal to 0.5 μm, it is possible to reliably cover the entire surface of the protective inorganic layer 14 (the inorganic layer 18) with the organic layer 16, and to make the surface of the organic layer 16, that is, the formation surface for the inorganic layer 18 flat.

In addition, when the thickness of the organic layer 16 is less than or equal to 5 μm, it is possible to preferably suppress occurrence of problems such as a cracks in the organic layer 16 or curling of the gas barrier film 10 due to the organic layer 16 which is excessively thick.

In consideration of the points described above, the thickness of the organic layer 16 is more preferably 1 μm to 3 μm.

Furthermore, when a plurality of organic layers 16 is formed as in a gas barrier film illustrated in FIG. 1B, thicknesses of the organic layers 16 may be identical to each other, or may be different from each other.

In addition, when a plurality of organic layers 16 is formed, formation materials of the respective organic layers 16 may be identical to each other, or may be different from each other. However, it is preferable that all the organic layers 16 be formed of the same material from a viewpoint of productivity or the like.

In the present invention, the organic layer 16 is basically formed (film formed) by a coating method.

That is, when the organic layer 16 is formed, first, the coating material in which the monomer or the oligomer to be the organic layer 16, and further, a polymerization initiator, a silane coupling agent, a surfactant, and the like are dissolved in the organic solvent is prepared. Next, the coating material is coated on the surface of the protective inorganic layer 14 (the inorganic layer 18) and is dried. After being dried, the monomer or the oligomer is polymerized by ultraviolet irradiation or electron beam irradiation, heating, or the like, and thus the organic layer 16 is formed.

Here, as described above, in the gas barrier film 10 of the present invention, the low retardation film is used as the support body 12. However, the gas barrier film 10 includes the protective inorganic layer 14 on the support body 12, and the organic layer 16 is formed thereon.

According to this configuration, in general, it is possible to use an organic solvent having a low boiling point such as MEK or MIBK which is not able to be used for forming a layer formed of an organic compound on a low retardation film in the coating material for forming the organic layer 16.

For this reason, the drying of the coating material is preferably controlled, that is, a behavior of the drying film is preferably controlled, and the coating material (a coating film) is dried with a high leveling property or a high coverage property, and thus a flat organic layer is able to be uniformly formed on the entire surface of the protective inorganic layer 14 (the inorganic layer 18). Accordingly, a suitable surface of the organic layer 16, that is, a suitable formation surface for the inorganic layer 18 is provided, and thus it is possible to form the inorganic layer 18 having a high gas barrier property at extreme density.

The inorganic layer 18 is a layer formed of an inorganic compound (a layer, which is a film, including an inorganic compound as a main component).

In the gas barrier film 10 of the present invention, the inorganic layer 18 mainly exhibits a target gas barrier property.

A formation material of the inorganic layer 18 is not limited, but various layers formed of an inorganic compound which exhibits a gas barrier property are able to be used.

Specifically, the inorganic compound exemplified in the protective inorganic layer 14 described above is preferably exemplified. In particular, silicon nitride, silicon oxide, silicon oxynitride, and aluminum oxide are preferably used in the gas barrier film from a viewpoint of enabling high transparency and an excellent gas barrier property to be exhibited. Among them, in particular, silicon nitride having high transparency in addition to an excellent gas barrier property is preferably used.

In the present invention, a thickness of the inorganic layer 18 may be suitably set to a thickness by which the target gas barrier property is exhibited according to the formation material.

The thickness of the inorganic layer 18 is preferably 10 nm to 200 nm.

When the thickness of the inorganic layer 18 is greater than or equal to 10 nm, it is possible to form the inorganic layer 18 stably exhibiting a sufficient gas barrier performance. In addition, the inorganic layer 18 is generally brittle, and thus when the inorganic layer 18 is excessively thick, splits or cracks, separation, or the like may occur, but when the thickness of the inorganic layer 18 is less than or equal to 200 nm, it is possible to prevent splits from occurring.

In addition, in consideration of such a point, the thickness of the inorganic layer 18 is, preferably 15 nm to 100 nm, and especially preferably 20 nm to 75 nm.

Furthermore, as in an example illustrated in FIG. 1B, when the gas barrier film includes a plurality of inorganic layers 18, thicknesses of the respective inorganic layers 18 may be identical to each other, or may be different from each other.

In addition, when the gas barrier film 10 includes a plurality of inorganic layers 18, formation materials of the respective inorganic layer 18 may be identical to each other, or may be different from each other.

In the gas barrier film 10 of the present invention, the inorganic layer 18 may be formed (film formed) by a forming method of a known inorganic layer (an inorganic film) according to the formation material.

Specifically, plasma CVD such as CCP-CVD or ICP-CVD, sputtering such as magnetron sputtering or reactive sputtering, and a vapor phase forming method such as vacuum deposition are preferably exemplified.

In consideration of production equipment, productivity, or the like, it is preferable that the inorganic layer 18 be formed by the same method as that of the protective inorganic layer 14 described above. Accordingly, it is preferable that the inorganic layer 18 be formed by plasma CVD.

Furthermore, when the inorganic layer 18 is formed by plasma CVD, similar to the above-described protective inorganic layer 14, a mixed layer in which a component of the organic layer and a component of the inorganic layer are mixed may be formed between the organic layer 16 and the inorganic layer 18 by adjusting bias power, or the like. Since the mixed layer is formed between the organic layer 16 and the inorganic layer 18, it is possible to improve adhesiveness between the organic layer 16 and the inorganic layer 18.

The gas barrier film 10 of an illustrated example includes the protective organic layer 20 on an uppermost layer as a preferred aspect. The protective organic layer 20 is a protective layer which protects the inorganic layer 18.

The inorganic layer 18 is a layer formed of an inorganic compound such as silicon nitride, and is hard and brittle. For this reason, damage such as splits or cracks easily occurs due to contact with other members, or by receiving an impact, or the like.

In the gas barrier film 10, the inorganic layer 18 mainly exhibits a gas barrier property. Accordingly, when the inorganic layer 18 is damaged, moisture, oxygen, or the like is able to permeate from a damaged portion, and thus the gas barrier property may be considerably degraded.

Regarding this, the protective organic layer 20 is formed on the uppermost layer, and thus the inorganic layer 18 is prevented from being damaged by contact or impact, and it is possible to prevent the gas barrier property from being degraded due to damage to the inorganic layer 18.

A formation material, a forming method, a film thickness, and the like of the protective organic layer 20 may be basically identical to that of the organic layer 16 described above.

In addition, film thicknesses and/or formation materials of the organic layer 16 and the protective organic layer 20 may be identical to each other, or may be different from each other. However, from a viewpoint of productivity or production equipment, it is preferable that the organic layer 16 and the protective organic layer 20 be formed of the same formation material.

Figure 2A:
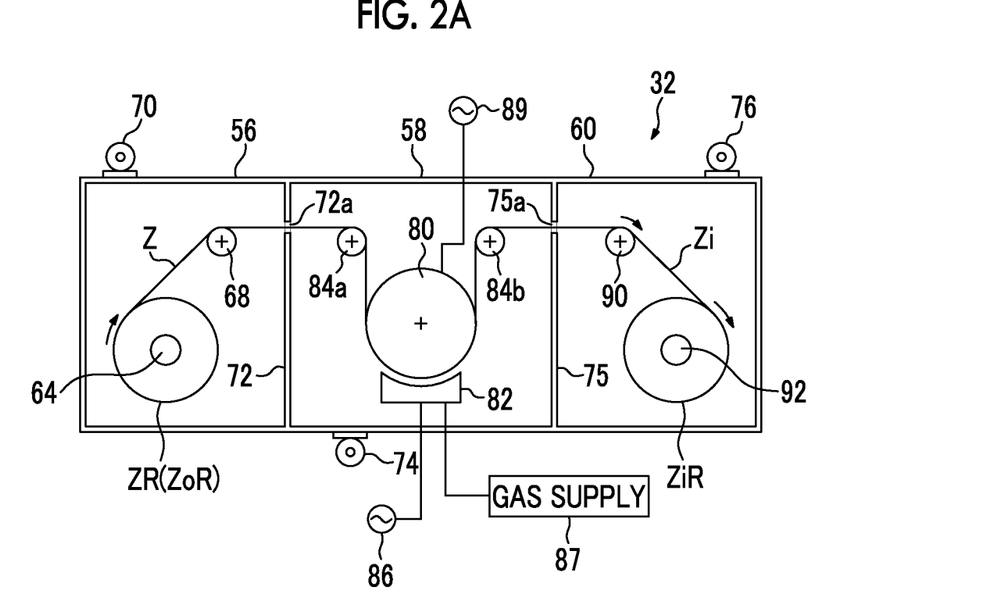
FIG. 2A is a formation device for an (protective) inorganic layer.
Figure 2B:
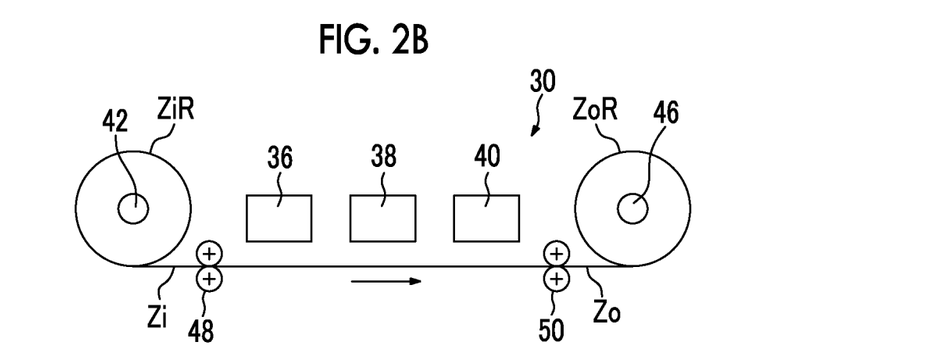
FIG. 2B is a formation device for an (protective) organic layer.
Figure 2C:
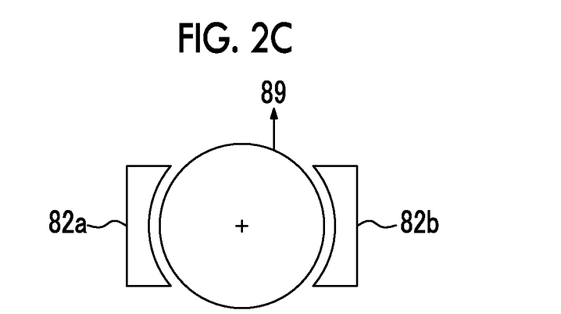
FIG. 2C is another example of a forming portion used in the formation device illustrated in FIG. 2A.

FIG. 2 conceptually illustrates an example of a manufacturing device with which the gas barrier film 10 (the functional film) of the present invention is manufactured.

The manufacturing device includes an inorganic formation device 32 which forms the protective inorganic layer 14, the mixed layer 24, and the inorganic layer 18, and an organic formation device 30 which forms the organic layer 16 and the protective organic layer 20.

FIG. 2A is the inorganic formation device 32, and FIG. 2B is the organic formation device 30.

The organic formation device 30 and the inorganic formation device 32 illustrated in FIGS. 2A and 2B are devices using so-called roll to roll processing (hereinafter, referred to as "RtoR") in which a film formation material is sent out from a roll which is formed by winding a long film formation material (a web-like film formation material) therearound, each layer is formed (film formed) while the film formation material is transported in a longitudinal direction, and the film formation material which forms each of the layers is wound again in the shape of a roll.

RtoR is able to efficiently manufacture the gas barrier film 10 (the functional film) at high productivity.

Furthermore, the gas barrier film 10 of the present invention is not limited to a method in which the functional film such as the gas barrier film is manufactured by RtoR using a long support body 12.

For example, the gas barrier film 10 may be manufactured by a so-called sheet-type (a batch-type) forming method using a cut sheet-like support body 12.

However, as described above, in the gas barrier film 10 of the present invention, an organic solvent having a low boiling point such as MEK which is able to secure excellent leveling or coverage is able to be used as a coating material for forming the organic layer 16, and thus in consideration of productivity or the like, it is preferable that the gas barrier film 10 be manufactured by using RtoR. In addition, as described later, it is possible to change formation conditions in a thickness direction by RtoR without changing plasma excitation power, a supplied amount of raw material gas, or the like during the forming of the protective inorganic layer 14, and thus it is possible to more preferably form the mixed layer 24.

Furthermore, even when a cut sheet-like film formation material Z is used, a forming method of the protective organic layer 14, the organic layer 16, the inorganic layer 18, and the protective organic layer 20 which is an organic layer is basically identical to a manufacturing method by RtoR described below.

The inorganic formation device 32 is a device which forms the mixed layer 24, the protective inorganic layer 14, and the inorganic layer 18 on a surface of the film formation material Z by CCP-CVD.

In the inorganic formation device 32, when the mixed layer 24 and the protective inorganic layer 14 are formed, the film formation material Z is the support body 12. In addition, when the inorganic layer 18 is formed, the film formation material Z is a material in which the mixed layer 24, the protective inorganic layer 14, and the organic layer 16 are formed on the support body 12.

Furthermore, as illustrated in FIG. 1B, when a gas barrier film including a plurality of combinations of the organic layer 16 and the inorganic layer 18 is manufactured, a material in which one or more combinations of the mixed layer 24 and the protective inorganic layer 14, and the organic layer 16 and the inorganic layer 18 are formed on the support body 12, and the uppermost layer is the organic layer 16 is also the film formation material Z of the inorganic formation device 32.

In the film formation material Z, the inorganic formation device 32 which forms the mixed layer 24 and the protective inorganic layer 14, or the inorganic layer 18, includes a supply chamber 56, a forming chamber 58, and a winding chamber 60.

Furthermore, the inorganic formation device 32 may include various members such as a guide member regulating a transportation roller pair or a position of the film formation material Z in a width direction (a direction perpendicular to a transportation direction), and various sensors which are disposed in a known device forming a film by a vapor phase deposition method while a long film formation material is transported in addition to the illustrated members.

In addition, in the following description, in particular, when it is not necessary to discriminate the mixed layer 24 and the protective inorganic layer 14 from the inorganic layer 18, all of the mixed layer 24, the protective inorganic layer 14, and the inorganic layer 18 are set to an inorganic layer.

The supply chamber 56 includes a rotational axis 64, a guide roller 68, and vacuum evacuation means 70.

In the inorganic formation device 32, a roll ZR around which the film formation material Z is wound is mounted on the rotational axis 64 of the supply chamber 56.

When the roll ZR is mounted on the rotational axis 64, the film formation material Z is passed (fed) into a predetermined transportation path from the supply chamber 56 to a winding axis 92 of the winding chamber 60 through the forming chamber 58. When the film formation material Z is sent out from the roll ZR, the inorganic formation device 32 using the RtoR synchronously winds the film formation material Z on which the inorganic layer is completely formed around the winding axis 92, and in the forming chamber 58, the inorganic layer is continuously formed in the film formation material Z while the film formation material Z is transported in the longitudinal direction.

In the supply chamber 56, the rotational axis 64 is rotated in a clockwise direction of the drawing by a driving source (not illustrated), and the film formation material Z is sent out from the roll ZR, is guided into the predetermined path by the guide roller 68, and thus is sent to the forming chamber 58 from a slit 72a formed on a partition wall 72.

Furthermore, in the inorganic formation device 32 of an illustrated example, as a preferred aspect, vacuum evacuation means 74 is disposed in the forming chamber 58, and vacuum evacuation means 76 is disposed in the winding chamber 60. In the inorganic formation device 32, during the forming of the inorganic layer, by the respective vacuum evacuation means, pressures of the supply chamber 56 and the winding chamber 60 are maintained at a predetermined pressure according to a pressure of the forming chamber 58 (a forming pressure of the inorganic layer, which is a film forming pressure) described later. Accordingly, the pressure of the adjacent chambers is prevented from affecting the pressure of the forming chamber 58 (the formation of the inorganic layer in the forming chamber 58).

The vacuum evacuation means 70 is not particularly limited, but various known (vacuum) evacuation means used in a formation device with a vacuum such as a vacuum pump such as a turbo pump, a mechanical booster pump, a dry pump, and a rotary pump are able to be used. Regarding this point, the same applies to other vacuum evacuation means 74 and 76 described later.

The forming chamber 58 forms the inorganic layer on the surface of the film formation material Z (the surface of the support body 12 or the organic layer 16) by CCP-CVD. Furthermore, as described above, in the present invention, the inorganic layer is able to be formed by various plasma CVD types such as ICP-CVD in addition to CCP-CVD.

In the illustrated example, the forming chamber 58 includes a drum 80, a shower electrode 82, guide rollers 84a and 84b, a high frequency power supply 86, gas supply means 87, a bias power supply 89, and the vacuum evacuation means 74 described above.

The film formation material Z transported to the forming chamber 58 is guided into the predetermined path by the guide rollers 84, and is wound around a predetermined position of the drum 80. The film formation material Z is transported in the longitudinal direction while being positioned at the predetermined position by the drum 80, and thus the inorganic layer 18 is continuously formed.

The vacuum evacuation means 74 performs vacuum evacuation with respect to the inside of the forming chamber 58, and sets a vacuum degree to be in accordance with the forming of the inorganic layer 18.

The drum 80 is a cylindrical member which is rotated around a center line as an axis in a counterclockwise direction of the drawing.

The film formation material Z which is supplied from the supply chamber 56, is guided into the predetermined path by the guide roller 84a, and is wound around the predetermined position of the drum 80 is wound around a predetermined region of a peripheral surface of the drum 80, and is transported into the predetermined transportation path while being supported and guided by the drum 80, and thus the inorganic layer is formed on the surface by CCP-CVD.

As described above, in the forming chamber 58 of the illustrated example, the inorganic layer is formed on the surface of the film formation material Z by CCP-CVD. The drum 80 functions as a counter electrode in CCP-CVD, and thus configures an electrode pair with the shower electrode 82 (a film forming electrode) described later.

Here, the bias power supply 89 for supplying bias power to the film formation material Z (the support body 12) is connected to the drum 80 during the forming of the inorganic layer.

As described above, in the gas barrier film 10, when the protective inorganic layer 14 is formed, the bias power supplied to the support body 12 is adjusted, and thus the support body 12 is actively etched and ions are actively pulled into the support body 12, and it is possible to form the mixed layer 24 between the support body 12 and the protective inorganic layer 14.

In a plasma CVD device, various power supplies are able to be used for the bias power supply 89 used for supplying the bias power to the film formation material Z. As an example, a high frequency power supply, an alternating or direct pulse power supply, or the like is exemplified.

Here, as the bias power supply 89, a bias power supply which is able to apply a bias having a frequency different from that of the high frequency power supply 86 described later is preferably used. As an example, a configuration in which a power supply of a frequency of 400 kHz is used as the bias power supply 89, and a power supply of a frequency of 13.56 MHz is used as the high frequency power supply 86 is exemplified.

Accordingly, it is possible to more preferably form a desired mixed layer 24.

Furthermore, in the drum 80, a connection and a ground connection with respect to the bias power supply 89 may be switched.

In addition, it is preferable that the drum 80 include temperature adjustment means which adjusts a temperature of the peripheral surface supporting the film formation material Z in order to cool or heat the film formation material Z. As described later, temperature adjustment of the drum 80 is also able to be used when forming the mixed layer 24.

The high frequency power supply 86 is a known high frequency power supply used in plasma CVD, and supplies plasma excitation power to the shower electrode 82.

The gas supply means 87 is known raw material gas (film forming gas and process gas) supply means used in plasma CVD, and supplies raw material gas to the shower electrode 82.

Furthermore, in the present invention, as the raw material gas, a combination of various known gases according to the inorganic layer to be formed is able to be used.

As an example, when a silicon nitride film is formed as the inorganic layer (the protective inorganic layer 14 and the inorganic layer 18), a combination of silane gas, ammonia gas, and nitrogen gas, a combination of silane gas, ammonia gas, and an inert gas, a combination of silane gas, ammonia gas, nitrogen gas, and hydrogen gas, a combination of silane gas, ammonia gas, an inert gas, and hydrogen gas, and the like are exemplified.

The shower electrode 82 is a known shower electrode (a shower plate) used in CCP-CVD.

That is, the shower electrode 82 is a case-like electrode which is arranged such that one surface faces the drum 80 and includes a hollow portion in an inner portion, and a plurality of through holes (a gas supply hole) communicating with the hollow portion is formed in a surface facing the drum 80.

Furthermore, in the shower electrode 82 of the illustrated example, the surface facing the drum 80 is bent in the transportation direction of the film formation material Z. According to this configuration, in the shower electrode 82, the surface facing the drum 80 is parallel to the peripheral surface of the drum 80, and a distance between the drum 80 (the film formation material Z) and the shower electrode 82 over the entire region in the transportation direction of the film formation material Z is uniform.

The gas supply means 87 supplies the raw material gas to the hollow portion of the shower electrode 82.

Accordingly, the raw material gas is supplied from the through holes formed in the surface facing the drum 80 into a space between the shower electrode 82 which is the film forming electrode and the drum 80 which is the counter electrode.

The inorganic layer is formed between the shower electrode 82 and the drum 80 by CCP-CVD while the film formation material Z is wound around the drum 80 and is transported in the longitudinal direction.

Here, when the protective inorganic layer 14 is formed, the bias power supplied from the bias power supply 89 is adjusted (in general, is adjusted to be strong). Accordingly, the support body 12 is strongly etched by plasma, and the ions forming the protective inorganic layer 14 are strongly pulled into the support body 12, and thus as described above, the mixed layer 24 is formed between the support body 12 and the protective inorganic layer 14. In addition, by adjusting an intensity of the bias power, it is possible to adjust a thickness of the mixed layer 24 (and the protective inorganic layer 14).

In addition, when the temperature adjustment means is disposed in the drum 80, and the protective inorganic layer 14 is formed, a method of increasing the temperature of the drum 80 within a range not exceeding a heat resistance temperature of the support body 12 is preferable in the forming method of the mixed layer 24. That is, by increasing the temperature of the drum 80, a temperature of the plasma and the temperature of the support body 12 increase, and thus the support body 12 is softened. By softening the support body 12, the etching of the support body 12 is accelerated, and thus it is possible to form the mixed layer 24 between the support body 12 and the protective inorganic layer 14. In addition, similar to the above description, the temperature of the drum 80 (that is, the temperature of the support body 12) is adjusted, and thus it is possible to adjust the thickness of the mixed layer 24 (and the protective inorganic layer 14).

Furthermore, the forming method of the mixed layer 24 by heating the drum 80 may be independently performed. However, when the drum 80 is heated, it is especially preferable that acceleration of the etching by the heating processing bias power and the forming of the mixed layer 24 by the pulled-in ions be assisted.

Furthermore, when the inorganic layer 18 is formed, the bias power may be supplied or may not be supplied from the bias power supply 89.

In addition, similar to the above description, when the inorganic layer 18 is formed, the bias power which is supplied at the time of forming the inorganic layer 18 is adjusted, and thus the mixed layer in which an organic layer component and an inorganic layer component are mixed may be formed between the organic layer 16 and the inorganic layer 18.

Furthermore, the formation conditions of the inorganic layer are not limited, and may be suitably set according to a type of raw material gas, a target film thickness, a film forming rate, or the like.

In the illustrated example, the surface facing the drum 80 of the shower electrode 82 is a curved surface parallel to the peripheral surface of the drum 80. However, the present invention is not limited thereto, and various known shapes of shower electrodes are able to be used.

CCP-CVD using the shower electrode is not limited, and the raw material gas may be supplied to a space between the film forming electrode and the drum by a nozzle or the like.

In addition, in the example described above, the bias power which is supplied to the support body 12 (the film formation material Z) is adjusted, and thus the mixed layer 24 is formed when the protective inorganic layer 14 is formed, but the present invention is not limited thereto.

For example, in the shower electrode 82, the formation conditions of the protective inorganic layer 14 are different in an upstream portion and a downstream portion, and thus the mixed layer 24 and the protective inorganic layer 14 may be formed such that the formation conditions are changed to a condition in which the support body 12 is more likely to be etched or the ions are more likely to be pulled into the support body 12 in the upstream portion (that is, an initial stage of forming start), and the formation conditions are changed to conditions in which a film is more likely to be attached in the downstream portion.

Specifically, a method of changing a distance to the drum 80 of the upstream portion and the downstream portion (bringing the upstream portion closer or bring the upstream portion further away), a method of making an amount of raw material gas supplied to the upstream portion be greater than that to the downstream portion, a method of making the plasma excitation power which is supplied to the upstream portion be stronger than that to the downstream portion, a method of making a residence time of the raw material gas in the upstream portion be longer than that of the raw material gas in the downstream side by controlling the evacuation, and the like are exemplified.

In addition, as illustrated in FIG. 2C, a plurality of (two in the illustrated example) shower electrodes 82a and 82b is disposed, and thus the mixed layer 24 may be formed when the protective inorganic layer 14 is formed.

That is, the mixed layer 24 and the protective inorganic layer 14 may be formed such that the protective inorganic layer 14 is formed in conditions where the support body 12 is more likely to be etched or the ions are more likely to be pulled into the support body 12 in the shower electrode 82a on an upstream side, and the protective inorganic layer 14 is formed in conditions where the film of the inorganic compound is more likely to be attached in the shower electrode 82b on a downstream side.

Such a method may be independently performed, and the method may be combined with the method of adjusting the bias power described above, or the like.

The film formation material Z, that is, the gas barrier film 10 in which the inorganic layer is formed by CCP-CVD while being supported and transported by the drum 80 is guided into the predetermined path by the guide roller 84b, and is transported to the winding chamber 60 from a slit 75a formed in a partition wall 75.

In the illustrated example, the winding chamber 60 includes a guide roller 90, a winding axis 92, and the vacuum evacuation means 76 described above.

The gas barrier film 10 transported to the winding chamber 60 is wound in the shape of a roll by the winding axis 92, and is supplied to the organic formation device 30 as a support body roll ZiR formed by winding the film formation material Zi in which the inorganic layer is formed.

The organic formation device 30 illustrated in FIG. 2B is a device in which a long film formation material Zi is coated with a coating material to be the organic layer 16 or the protective organic layer 20 while being transported in the longitudinal direction, and is dried, and then an organic compound contained in a coating film is crosslinked and cured by light irradiation, and the organic layer 16 or the protective organic layer 20 is formed.

That is, in the organic formation device 30, when the organic layer 16 is formed, the film formation material Zi is a material in which the mixed layer 24 and the protective inorganic layer 14 are formed on the support body 12. In addition, when the protective organic layer 20 is formed, the film formation material Zi may be a material in which the mixed layer 24 and the protective inorganic layer 14, and the organic layer 16 and the inorganic layer 18 are formed on the support body 12.

Furthermore, as illustrated in FIG. 1B, when a gas barrier film including a plurality of combinations of the organic layer 16 and the inorganic layer 18 is manufactured, a material in which one or more combinations of the mixed layer 24 and the protective inorganic layer 14, and the organic layer 16 and the inorganic layer 18 are formed on the support body 12, and the uppermost layer is the inorganic layer 18 is also the film formation material Zi of the organic formation device 30.

As an example, the organic formation device 30 forming the organic layer 16 or the protective organic layer 20 in the film formation material Zi includes coating means 36, drying means 38, light irradiation means 40, a rotational axis 42, a winding axis 46, and a transportation roller pair 48 and 50.

Furthermore, the organic formation device 30 may include various members such as a transportation roller pair, a guide member for the film formation material Zi, and various sensors which are disposed in a known device forming a film by coating while a long film formation material is transported in addition to the illustrated members.

In addition, in the following description, in particular, when it is not necessary to discriminate the organic layer 16 from the protective organic layer 20, both of the organic layer 16 and the protective organic layer 20 are set to an organic layer.

In the organic formation device 30, the support body roll ZiR formed by winding the long film formation material Zi in which the inorganic layer is formed is mounted on the rotational axis 42. When the support body roll ZiR is mounted on the rotational axis 42, the film formation material Zi is drawn from the support body roll ZiR, and passes through lower portions of the coating means 36, the drying means 38, and the light irradiation means 40 through the transportation roller pair 48, and is passed (fed) into a predetermined transportation path leading to the winding axis 46 through the transportation roller pair 50.

In the organic formation device 30 using RtoR, when the film formation material Zi is sent out from the support body roll ZiR, the film formation material Zi in which the organic layer is formed is synchronously wound around the winding axis 46. Accordingly, the long film formation material Zi is coated with the coating material to be the organic layer by the coating means 36 while being transported in the longitudinal direction through the predetermined transportation path, and the coating material is dried by the drying means 38 and is cured by the light irradiation means 40, and thus the organic layer is formed.

The coating means 36 coats a surface of the film formation material Zi with a coating material for forming the organic layer which is prepared in advance.

The coating material is formed by dissolving an organic compound (a monomer/an oligomer) to be the organic layer by being crosslinked and polymerized in an organic solvent. In addition, preferably, the coating material contains a silane coupling agent in order to improve adhesiveness of the organic layer. Furthermore, necessary components such as a surfactant (a surface adjustment agent) and a polymerization initiator (a crosslinking agent) may be suitably added to the coating material.

Here, as described above, in the present invention, even though the low retardation film is used in the support body 12, the protective inorganic layer 14 is included, and thus it is possible to use the organic solvent having a low boiling point such as MEK or MIBK in the coating material for forming the low organic layer 16.

For this reason, in order to preferably control the drying by the drying means 38 described later, it is preferable that an organic solvent having a low boiling point be used as the organic solvent of the coating material.

In the coating means 36, a method for coating the film formation material Zi with the coating material is not particularly limited.

Accordingly, as the coating method of the coating material, all known coating methods of a coating material such as a die coating method, a dip coating method, an air knife coating method, a curtain coating method, a roller coating method, a wire bar coating method, a gravure coating method, and a slide coating method are able to be used.

Among them, a die coating method is preferably used due to reasons that the coating material is able to be coated in a non-contact manner, and thus the surface of the film formation material Zi (that is, the inorganic layer) is not damaged, and an embedding property such as irregularities in the surface of the film formation material Zi is excellent due to forming a bead (a liquid reservoir).

Next, as described above, the film formation material Zi is transported to the drying means 38, and the coating material which is coated by the coating means 36 is dried.

A method for drying the coating material by the drying means 38 is not limited, and all known drying means are able to be used insofar as the coating material is dried (the organic solvent is removed), and thus is able to be in a state of enabling crosslinking before the film formation material Zi reaches the light irradiation means 40. Various known methods are able to be used. As an example, heat drying by a heater, heat drying by hot air, and the like are exemplified.

As described above, in the present invention, an organic solvent having a low boiling point such as MEK or MIBK is able to be used as the organic solvent.

For this reason, the drying of the coating material is preferably controlled, that is, a behavior of the drying film is preferably controlled, and the coating material (a coating film) is dried with a high leveling property or a high coverage property, and thus an organic layer having a flat surface is able to be uniformly formed on the entire surface of the protective inorganic layer 14 (the inorganic layer 18). Accordingly, a suitable surface of the organic layer 16, that is, a suitable formation surface for the inorganic layer 18 is provided, and thus it is possible to form the inorganic layer 18 having a high gas barrier property at extreme density.

Next, the film formation material Zi is transported to the light irradiation means 40. In the light irradiation means 40, the coating material which is coated by the coating means 36 and is dried by the drying means 38 is irradiated with ultraviolet rays (UV light), visible light, or the like, the organic compound (the monomers or the oligomers of the organic compound) contained in the coating material is crosslinked (polymerized) and cured, and the organic layer (the organic layer 16/the protective organic layer 20) is formed.

When the coating film is cured by the light irradiation means 40, as necessary, a light irradiation region of the film formation material Zi with respect to the light irradiation means 40 may be in an inert atmosphere (an oxygen-free atmosphere) by a nitrogen substitution or the like. In addition, as necessary, a temperature of the film formation material Zi, that is, a temperature of the coating film may be adjusted at the time of being cured by using a back-up roller abutting a back surface or the like.

Furthermore, in the present invention, the crosslinking of the organic compound to be the organic layer is not limited to photopolymerization. That is, as a method for crosslinking the organic compound, various methods such as heat polymerization, electron beam polymerization, and plasma polymerization according to the organic compound to be the organic layer 16 are able to be used.

In the present invention, as described above, an acryl-based resin such as an acrylic resin or a methacrylic resin is preferably used as the organic layer 16, and photopolymerization is preferably used.

Then, a film formation material Zo in which the organic layer is formed is transported by being pinched by the transportation roller pair 50, reaches the winding axis 46, and is wound around the winding axis 46 in the shape of a roll again, and thus a roll ZoR in which the film formation material Zo is wound is formed.

The roll ZoR is a roll which is formed by winding the gas barrier film 10, and is shipped out or stored, or is supplied to a next process or the like. Furthermore, alternatively the roll ZoR is further the roll ZR formed by winding the film formation material Z in which the inorganic layer 18 is formed, and is supplied to the inorganic formation device 32 described above.

When the gas barrier film 10 illustrated in FIG. 1A is manufactured by using the manufacturing device illustrated in FIG. 2, first, the roll (the roll ZR) which is formed by winding the support body 12 is mounted on the rotational axis 64 of the supply chamber 56 in the inorganic formation device 32, and the protective inorganic layer 14 is formed on the support body 12 by the inorganic formation device 32.

When the protective inorganic layer 14 is formed, the bias power supplied from the bias power supply 89 to the support body 12 is adjusted in the forming chamber 58, and the mixed layer 24 is formed between the support body 12 and the protective inorganic layer 14.

Furthermore, as described above, it is preferable that the protective inorganic layer 14 be formed with a width wider than a coating width of the coating material coated by the organic formation device 30 in the width direction.

Next, the roll (the support body roll ZiR) formed by winding the support body 12 on which the protective inorganic layer 14 and the mixed layer 24 are formed is mounted on the organic formation device 30, and the organic layer 16 is formed on the protective inorganic layer 14.

Next, the roll (the roll ZoR) formed by winding the support body 12 on which the organic layer 16 is formed is mounted on the inorganic formation device 32 again, and the inorganic layer 18 is formed on the organic layer 16.

Finally, the roll (the support body roll ZiR) formed by winding the support body 12 on which the inorganic layer 18 is formed is mounted on the organic formation device 30, and the protective organic layer 20 is formed on the inorganic layer 18, and thus the gas barrier film 10 is completed.

The roll formed by winding the gas barrier film 10 is shipped out or stored as a product, or is supplied to the next process or the like.

Furthermore, as illustrated in FIG. 1B, when a gas barrier film including two combinations of the organic layers 16 as the base and the inorganic layers 18 is manufactured, the inorganic layer 18 is formed, and then a second organic layer 16 is formed on the inorganic layer 18 by the organic formation device 30 again, and then a second inorganic layer 18 is formed on the organic layer 16 by the inorganic formation device 32, and finally the protective organic layer 20 is formed by the organic formation device 30, and thus a gas barrier film including two combinations of the organic layer 16 and the inorganic layer 18 may be formed.

In addition, when a gas barrier film including three or more combinations of the organic layer 16 as the base and the inorganic layer 18 is manufactured, the forming of the organic layer 16 by the organic formation device 30 and the forming of the inorganic layer 18 by the inorganic formation device 32 may be repeated according to the number of combinations.

The organic Electro-Luminescence (EL) device (an Organic light-emitting diode (OLED) device) of the present invention is an organic EL device using the gas barrier film (the functional film) of the present invention.

In the organic EL device of the present invention, the gas barrier film 10 of the present invention is able to be used for various members. As an example, in the organic EL device, a method in which the gas barrier film 10 of the present invention is used instead of the glass substrate on the light extraction side is exemplified.

In addition, when a phase difference film or a polarization plate for controlling external light is disposed in the organic EL device sealed with glass, a method in which the gas barrier film of the present invention is used as a protective film of the phase difference film or the polarization plate is exemplified. By using the gas barrier film of the present invention as the protective film of the phase difference film or the like, it is possible to prevent separation of the phase difference film from the glass substrate or deformation of the phase difference film due to expansion of a base material due to external humidity or heat.

As described above, the functional film and the organic EL device of the present invention have been described in detail, but the present invention is not limited to the example described above, and may be variously improved or changed within the scope not departing from the gist of the present invention.

EXAMPLE

Hereinafter, the present invention will be described in more detail by giving specific examples of the present invention.

Example 1

As the support body 12, a long polycarbonate film having a width of 1000 mm and a thickness of 70 μm (Pure-Ace T138 manufactured by Teijin Chemicals Ltd.) was prepared.

A retardation value of the polycarbonate film was 138±3 nm (a catalogue value).

The protective inorganic layer 14 having a thickness of 50 nm and the mixed layer 24 having a thickness of 10 nm were formed on the support body 12 by the inorganic formation device 32 as illustrated in FIG. 2A.

As the raw material gas, silane gas ($SiH_4$), ammonia gas ($NH_3$), nitrogen gas ($N_2$), and hydrogen gas ($H_2$) were used. Supplied amounts of the silane gas from the gas supply means 87, the ammonia gas, the nitrogen gas, and the hydrogen gas were 100 sccm, 200 sccm, 500 sccm, and 500 sccm, respectively. In addition, a forming pressure was 50 Pa.

That is, the protective inorganic layer 14 was a silicon nitride layer, and the mixed layer 24 was a mixed layer of a silicon nitride component and a polycarbonate component.

The plasma excitation power supplied from the high frequency power supply 86 was 3000 W at a frequency of 13.5 MHz. In addition, the bias power supplied from the bias power supply 89 was 500 W at a frequency of 400 kHz.

As described above, the film thicknesses of the protective inorganic layer 14 and the mixed layer 24 were controlled by a film forming rate or the like obtained by a test in advance.

Next, the organic layer 16 having a thickness of 2000 nm was formed on the surface of the protective inorganic layer 14 by the organic formation device 30 as illustrated in FIG. 2B.

The coating material for forming the organic layer 16 was prepared by adding TMPTA (manufactured by Daicel-Cytec Company Ltd.), a surfactant (BYK378 manufactured by BYK Chemie Japan), a photopolymerization initiator (Irg184 manufactured by Ciba Chemicals), and a silane coupling agent (KBM5103 manufactured by Shin-Etsu Silicon) in methyl ethyl ketone (MEK). That is, the organic layer 16 was a layer formed by polymerizing TMPTA.

An added amount of the surfactant was a concentration of 1 mass % where the organic solvent was excluded, an added amount of the photopolymerization initiator was a concentration of 2 mass % where the organic solvent was excluded, and an added amount of the silane coupling agent was a concentration of 10 mass % where the organic solvent was excluded (that is, there was 87 mass % of the organic compound in a solid content). In addition, a solid content concentration of the coating material in which the components blended in such a ratio were diluted with MEK was 15 mass %.

As the coating means 36, a die coater was used. As the drying means 38, a device for blasting out drying air flow from a nozzle was used, and the drying was performed at 80° C. Furthermore, ultraviolet rays were emitted from the light irradiation means 40, and polymerization was performed. Furthermore, the curing by the ultraviolet rays was performed while the support body 12 was heated from the back surface side at 80° C.

Next, the inorganic layer 18 having a thickness of 50 nm was formed on the surface of the organic layer 16 by the inorganic formation device 32 as illustrated in FIG. 2A.

The forming of the inorganic layer 18 was performed in the same manner as that in the forming of the protective inorganic layer 14 (and the mixed layer 24) described above except that the bias power supplied from the bias power supply 89 was 300 W. That is, the inorganic layer 18 was a silicon nitride layer.

Finally, the protective organic layer 20 having a thickness of 2000 nm was formed in entirely the same manner as that of the organic layer 16 described above by the organic formation device 30 as illustrated in FIG. 2B, and thus the gas barrier film 10 as illustrated in FIG. 1A was manufactured. That is, the protective organic layer 20 was also a layer formed by polymerizing TMPTA.

Comparative Example 1

Similar to Example 1, on the surface of the support body 12, the organic layer (a polymerized layer of TMPTA) having a thickness of 2000 nm was formed in the same manner as that of the organic layer 16 of Example 1. Next, the inorganic layer (a silicon nitride layer) having a thickness of 50 nm was formed on the organic layer in the same manner as that of the inorganic layer 18 of Example 1.

After this, similar to Example 1, the organic layer 16, the inorganic layer 18, and the protective inorganic layer 20 were formed, and the gas barrier film in which the organic layer/the inorganic layer/the organic layer 16/the inorganic layer 18/the protective organic layer 20 were formed on the support body 12 was manufactured.

Example 2

The gas barrier film 10 as illustrated in FIG. 1A was manufactured in the same manner as that of Example 1 except that when the protective inorganic layer 14 was formed, the bias power supplied from the bias power supply 89 was changed to 100 W, the film thickness of the mixed layer 24 was 3 nm, and the film thickness of the protective inorganic layer 14 was 50 nm.

Example 3

The gas barrier film 10 as illustrated in FIG. 1A was manufactured in the same manner as that of Example 1 except that when the protective inorganic layer 14 was formed, the bias power supplied from the bias power supply 89 was changed to 700 W, the film thickness of the mixed layer 24 was 50 nm, and the film thickness of the protective inorganic layer 14 was 50 nm.

Example 4

The gas barrier film 10 as illustrated in FIG. 1A was manufactured in the same manner as that of Example 1 except that when the protective inorganic layer 14 was formed, the bias power supplied from the bias power supply 89 was changed to 1000 W, the film thickness of the mixed layer 24 was 100 nm, and the film thickness of the protective inorganic layer 14 was 50 nm.

Comparative Example 2

The gas barrier film 10 as illustrated in FIG. 1A was manufactured in the same manner as that of Example 1 except that when the protective inorganic layer 14 was formed, the bias power supplied from the bias power supply 89 was changed to 10 W, the film thickness of the mixed layer 24 was 0.5 nm, and the film thickness of the protective inorganic layer 14 was 50 nm.

Comparative Example 3

The gas barrier film 10 as illustrated in FIG. 1A was manufactured in the same manner as that of Example 1 except that when the protective inorganic layer 14 was formed, the bias power supplied from the bias power supply 89 was changed to 1500 W, the film thickness of the mixed layer 24 was 200 nm, and the film thickness of the protective inorganic layer 14 was 50 nm.

[Evaluation]

With respect to the gas barrier films of Examples 1 to 4 and Comparative Examples 1 to 3 manufactured thereby, a gas barrier property, total light beam transmissivity, haze, and a retardation value were evaluated.

<Gas Barrier Property>

The water vapor transmissivity of the manufactured gas barrier film $[g/(m^2 \cdot day)]$ was measured by a calcium corrosion test (a method disclosed in JP2005-283561A). Furthermore, conditions in a thermohygrostat treatment were a temperature of 40° C. and a humidity of 90% RH.

Water vapor transmissivity of less than $1 \times 10^{-4}$ $[g/(m^2 \cdot day)]$ was evaluated as "Excellent";

Water vapor transmissivity of greater than or equal to $1 \times 10^{-4}$ $[g/(m^2 \cdot day)]$ and less than $2 \times 10^{-4}$ $[g/(m^2 \cdot day)]$ was "Good";

Water vapor transmissivity of greater than or equal to $2 \times 10^{-4}$ $[g/(m^2 \cdot day)]$ and less than $1 \times 10^{-3}$ $[g/(m^2 \cdot day)]$ was "Acceptable"; and Water vapor transmissivity of greater than or equal to $1 \times 10^{-3}$ $[g/(m^2 \cdot day)]$ was "Not Acceptable".

<Total Light Beam Transmissivity>

The total light beam transmissivity of the manufactured gas barrier film was measured by using a NDH5000 manufactured by Nippon Denshoku Industries Co., Ltd on the basis of JIS K 7361.

Total light beam transmissivity of greater than or equal to 80% was evaluated as "Good"; and Total light beam transmissivity of less than 80% was "Not Acceptable".

<Haze>

The haze of the manufactured gas barrier film was measured by using a NDH5000 manufactured by Nippon Denshoku Industries Co., Ltd on the basis of JIS K 7136.

Haze of less than or equal to 2% was evaluated as "Good"; and

Haze exceeding 2% was "Not Acceptable".

<Retardation>

The retardation value of the manufactured gas barrier film was measured at an incident angle of 0°, and a measurement wavelength of 500 nm by using a KOBRA manufactured by Oji Scientific Instruments.

As described above, the retardation value of the polycarbonate film which was the support body 12 was 138±3 nm.

A retardation value within a range of 138±3 nm (that is, a retardation value identical to that of the support body 12) was evaluated as "Good";

A retardation value not within the range of 138±3 nm, but within a range of 138±10 nm was "Acceptable"; and A retardation value not within the range of 138±10 nm was "Not Acceptable".

The results described above are shown in the following table.

TABLE 1

| | Mixed Layer [nm] | Gas Barrier Property [g/(m2·day)] | Gas Barrier Property Evaluation | Total Light Beam Transmissivity [%] | Total Light Beam Transmissivity Evaluation | Haze [%] | Haze Evaluation | Retardation [nm] | Retardation Evaluation |
|---|---|---|---|---|---|---|---|---|---|
| Example 1 | 10 | $6.7 \times 10^{-5}$ | Excellent | 83.8 | Good | 0.7 | Good | 137 | Good |
| Comparative Example 1 | — | $5.0 \times 10^{-5}$ | Excellent | 70.0 | Not Acceptable | 5.0 | Not Acceptable | 100 | Not Acceptable |
| Example 2 | 3 | $3.0 \times 10^{-4}$ | Acceptable | 83.5 | Good | 0.5 | Good | 138 | Good |
| Example 3 | 50 | $3.2 \times 10^{-5}$ | Excellent | 81.0 | Good | 0.9 | Good | 136 | Good |
| Example 4 | 100 | $2.1 \times 10^{-4}$ | Acceptable | 80.0 | Good | 1.0 | Good | 135 | Good |
| Comparative Example 2 | 0.5 | $1.1 \times 10^{-3}$ | Not Acceptable | 84.0 | Good | 0.4 | Good | 137.5 | Good |
| Comparative Example 3 | 200 | $1.3 \times 10^{-3}$ | Not Acceptable | 75.0 | Not Acceptable | 2.0 | Not Acceptable | 130 | Acceptable |

As described above, Comparative Example 1 was a configuration in which the mixed layer 24 and the protective inorganic layer 14 were not formed, the organic layer of 2000 nm was formed on the support body 12 by a coating method according to a coating material using MEK, the inorganic layer of 50 nm was formed thereon, and the organic layer 16, the inorganic layer 18, and the protective organic layer 20 were formed thereon similarly to the other examples.

All of the other examples have the same configuration but for the thickness of the mixed layer 24.

As shown in the table described above, all of the gas barrier films of the present invention in which the protective inorganic layer 14 was formed, and the mixed layer 24 having a thickness of 1 to 100 nm was formed between the support body 12 and the protective inorganic layer 14 exhibited a high gas barrier property and optical characteristics which were compatible with each other. In addition, in all of the gas barrier films of the present invention, the retardation value was within the range of 138±3 nm, that is, the retardation value was identical to that of the support body 12 (the polycarbonate film) which is a base film (from a viewpoint of the retardation value, equivalent to the support body 12).

In particular, in more suitable Examples 1 and 3, the thickness of the mixed layer 24 exhibited an extremely high gas barrier property such that the water vapor transmissivity was less than $1\times10^{-4}$ [g/(m$^2$·day)] and excellent optical characteristics which were compatible with each other.

Regarding this, Comparative Example 1 that is a conventional laminated gas barrier film, which does not comprise the mixed layer 24 and the protective inorganic layer 14 and comprises an the organic layer formed directly on the surface of the support body 12, had an excellent gas barrier property; however, it is considered that Comparative Example 1 considerably degrades the optical characteristics because dissolution of the support by the coating material for forming the organic layer on the support body 12 considerably changes the retardation value of the support 12.

In addition, in Comparative Example 2, it is considered that the mixed layer 24 was formed, but the thickness was too thin at 0.5 nm, and thus it was not possible to relax the deformation of the inorganic layer 18 due to the deformation of the support body 12 due to high temperature and high humidity, the inorganic layer 18 was damaged, and the gas barrier property was degraded.

Furthermore, in Comparative Example 3, it is considered that the mixed layer 24 was formed, but the thickness was too thick at 200 nm, and thus the retardation value was considerably different from that of the support body 12 due to the mixed layer 24 which was too thick, the optical characteristics were degraded, and cracks occurred in the mixed layer 24, and thus the gas barrier property was degraded.

From the results described above, the effects of the present invention are clear.

The present invention is able to be preferably used for a substrate or a protective film of an organic EL device, an organic EL display or an organic EL illumination device, and the like.

What is claimed is:

1. A functional film, comprising:
   a support body of which a retardation value is less than or equal to 300 nm;
   a protective inorganic layer which is formed on the support body;
   one or more combinations of an inorganic layer and an organic layer as a base for the inorganic layer, the combinations being formed on the protective inorganic layer; and
   a mixed layer having a thickness of 1 nm to 100 nm which is formed between the support body and the protective inorganic layer, and is mixed with a component of the support body and a component of the protective inorganic layer,
   wherein each of the protective inorganic layer and the inorganic layer is a silicon nitride layer.

2. The functional film according to claim 1,
   wherein the organic layer contains a silane coupling agent.

3. The functional film according to claim 1,
   wherein total light beam transmissivity is greater than or equal to 80%, haze is less than 2%, and water vapor transmissivity is less than $1\times10^{-4}$ [g/(m$^2$·day)].

4. The functional film according to claim 1, wherein the protective inorganic layer, or the protective inorganic layer and the inorganic layer are formed by plasma CVD.

5. An organic EL device including the functional film according to claim 1.

6. The functional film according to claim 1,
   wherein the organic layer is a layer which is formed by polymerizing at least one of an acrylate compound and a methacrylate compound, and of which a glass transition temperature is higher than or equal to 120° C.

7. The functional film according to claim 6,
   wherein at least one of the acrylate compound and the methacrylate compound is a tri- or higher functional compound.

8. The functional film according to claim 1,
   wherein a protective organic layer is formed on an uppermost layer.

9. The functional film according to claim 8,
   wherein the protective organic layer is a layer which is formed by polymerizing at least one of a tri- or higher functional acrylate compound and a tri- or higher functional methacrylate compound and contains a silane coupling agent, and of which a glass transition temperature is higher than or equal to 120° C.

10. The functional film according to claim 1,
    wherein the support body is formed of one selected from a polycarbonate, a cyclo-olefin polymer, a cyclo-olefin copolymer, triacetyl cellulose, and a polyimide.

11. The functional film according to claim 1,
    wherein a formation region of the protective inorganic layer is wider than a formation region of the organic layer.

12. A functional film, comprising:
    a support body of which a retardation value is less than or equal to 300 nm;
    a protective inorganic layer which is formed on the support body;
    one or more combinations of an inorganic layer and an organic layer as a base for the inorganic layer which are formed on the protective inorganic layer;
    a mixed layer having a thickness of 1 nm to 100 nm which is formed between the support body and the protective inorganic layer, and is mixed with a component of the support body and a component of the protective inorganic layer; and
    a protective organic layer which is formed on an uppermost layer;
    wherein each of the protective inorganic layer and the inorganic layer is a silicon nitride layer,
    wherein the support body is formed of one selected from a polycarbonate, a cyclo-olefin polymer, a cyclo-olefin copolymer, triacetyl cellulose, and a polyimide.

* * * * *